United States Patent [19]

Landau

[11] 4,407,708
[45] Oct. 4, 1983

[54] METHOD FOR OPERATING A MAGNETRON SPUTTERING APPARATUS

[75] Inventor: Richard F. Landau, Morgan Hill, Calif.

[73] Assignee: Eaton Corporation, Cleveland, Ohio

[21] Appl. No.: 290,457

[22] Filed: Aug. 6, 1981

[51] Int. Cl.³ ............................................. C23C 15/00
[52] U.S. Cl. ................................ 204/192 R; 204/298
[58] Field of Search ................ 204/192 R, 192 C, 298

[56] References Cited

U.S. PATENT DOCUMENTS

| | | | |
|---|---|---|---|
| 4,198,283 | 4/1980 | Class et al. | 204/298 |
| 4,200,510 | 4/1980 | O'Connell et al. | 204/192 R |
| 4,219,397 | 8/1980 | Clarke | 204/192 R |
| 4,324,631 | 4/1982 | Meckel et al. | 204/192 M |

*Primary Examiner*—Aaron Weisstuch
*Attorney, Agent, or Firm*—C. H. Grace; F. M. Sajovec

[57] ABSTRACT

An improved magnetron sputter source (10) in which a temperature sensor (94) is placed within the cathode (18) adjacent the interface between the cathode and the sputter target (16) at the point of maximum erosion of the target. A relationship between the temperature of the cathode and the thickness of the target at that point is established so that the temperature reading can be used as an indication that the target is about to be eroded through.

2 Claims, 2 Drawing Figures

METHOD FOR OPERATING A MAGNETRON SPUTTERING APPARATUS

The present invention relates to apparatus for cathode sputtering and particularly to an improved cathode assembly in a magnetron sputtering system.

Cathode sputtering is widely used for depositing thin films of material onto substrates. The process involves vaporizing a material by ion bombardment of a target composed of the material, the target forming part of a cathode assembly in an evacuated chamber containing an inert gas such as argon. The mechanism in which the cathode is incorporated may be of the type known as a magnetron wherein a magnetic field is generated across the cathode assembly to which a sufficient negative voltage is applied to ionize and impel the gas atoms against the cathode, causing the metal thereof to be vaporized and, in turn, to be deposited as a film on a substrate positioned in close proximity to the cathode assembly.

When the cathode material (metal and dielectric films) is deposited upon the substrate, a trough is eroded in the target which corresponds to the shape of the magnetic field generated by the magnetron. If the target is allowed to erode through, severe damage and contamination by the cathode material can result to the remainder of the cathode assembly. On the other hand, since very costly materials such as gold, platinum, silver or palladium are used as targets it is important that as much of the target material as is pratical be used up before the target is replaced.

Prior art approaches to obtaining maximum yield from a target include targets having particular shapes, and targets which are made up of reversible tiles of target material. While these are effective, such special target shapes can be expensive to fabricate, and can require special means for retaining the target as part of the cathode assembly. An important object of the present invention is to provide a sputter source incorporating a simply shaped target which is easily replaceable, and which includes means for determining when the target is close to being eroded away so that the used target can be removed before portions of the remainder of the cathode assembly are eroded.

To meet the above objective, the present invention provides a magnetron sputter source incorporating a cathode assembly which includes an annular sputter target. A temperature sensor is disposed within the cathode assembly adjacent the area of maximum erosion of the target material. Experimentation has shown that the temperature sensed by such a temperature sensor is related to the thickness of the target material at that location so that the temperature reading can be used as an indication of the thickness of the target. This permits the target to be used up to but not past the point at which it is eroded through, thus optimizing the useful life of the target material.

Other objects and advantages of the invention will be apparent from the following description when taken in connection with the accompanying drawings, wherein.

Figure 1:
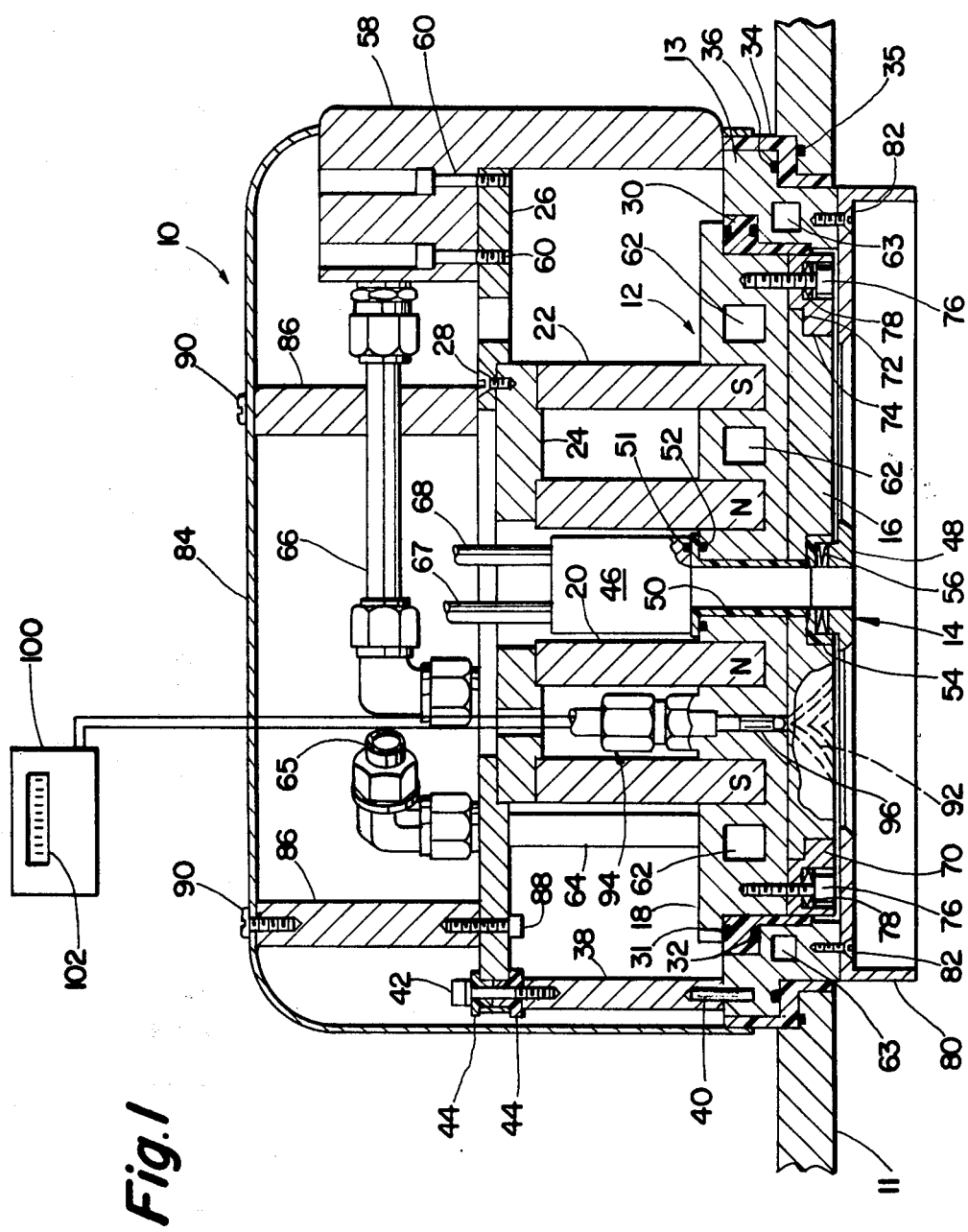
FIG. 1 is a cross sectional view of the sputter source of the invention.

Referring to FIG. 1, there is illustrated a sputter source 10, including a base plate 11, a cathode assembly 12 supported by the base plate, an outer anode 13, an inner anode assembly 14 and a target 16. Sputter sources per se are well-known in the art, as illustrated by U.S. Pat. No. 4,219,397 to Clarke, and by U.S. Pat. No. 4,204,936 to Hartsough, and will not be described in great detail herein.

The cathode assembly 12 comprises an annular cathode plate 18, an inner annular permanent magnet 20 received in an annular channel formed in plate 18, an outer annular permanent magnet 22 received in a second channel, an annular keeper plate 24 which is received over the magnets and in contact therewith, and an annular support plate 26 which is attached to the keeper plate by means of screws 28.

The outer anode 13 is in the form of a ring which encircles the cathode plate 18 and is insulated therefrom by means of an insulating ring 30, the ring 30 also including O-ring seals 31 and 32 received in grooves formed therein. A second insulating ring 34 encircles the anode 13 and insulates it from the base plate 11, a seal being effected between the anode and the base plate by means of an O-ring 35 received in a groove formed in the base plate 11 and an O-ring 36 received in a groove formed in the anode 13. The support plate 26 is spaced from and supported on the anode 13 by means of a plurality of spacer posts 38 (only one of which is shown in FIG. 1) which are attached to the anode 13 by means of pins 40, and to the support plate 26 by means of screws 42 which are received through insulating bushings 44 which maintain electrical insulation between the anode and cathode assemblies.

The center anode assembly 14 comprises a base member 46 which is received through the center of annular cathode plate 18 and target 16 and a center anode 48 which is threadedly received on the extended lower end of the base member 46. A tubular insulator 50 is received between the base member and the cathode plate, and a seal is effected therebetween by means of O-rings 51 and 52. The insulator 50 extends downward to also insulate the base member from the target 16, and a cup-shaped insulator 54 is received between the center anode 48 and the target 16. Spring washers 56 are received between the center anode 48 and the insulator 54, as will be described later.

Since high temperatures are generated in the sputtering process, cooling means are provided to control the temperature of the cathode and anode assemblies. To this end, a liquid coolant manifold 58 is attached to the support plate 26 by means of screws 60, and is connected to a liquid coolant source (not shown). To distribute the coolant, passages 62 and 63 are formed in the cathode plate 18 and the outer anode 13 respectively, along with other passages not shown in FIG. 1, and are connected to the manifold 58 by means of tubes 64, 65, 66. Also, base member 46 has a cooling chamber formed therein (not shown) which is connected to the manifold 58 by means of tubes 67, 68.

The target 16 which is to be vaporized comprises an annular member which is received against the lower face of cathode plate 18 and retained thereagainst by an annular retaining member 70. The target 16 is formed with an outwardly extending lip 72, which is engaged by an inwardly extending lip 74 formed on the retaining member 70, and the retaining member is attached to the cathode plate 18 by a plurality of screws 76, thus clamping the target into engagement with the cathode plate. The target 16 is also retained against the cathode plate by the center anode 13 acting against the cup-shaped insulator 54 through spring washers 56. The spring washers 56 and spring washers 78 received over the screws 76 apply a predetermined preload to the target and serve to maintain a clamping force on the target which compensates for the reduction in clamping force which occurs due to differential expansion of the liquid cooled cathode assembly, and the relatively hotter target. In accordance with known practice, a capture shield 80 is attached to the outer anode 13 by means of screws 82.

The portion of the source 10 which is above the base plate 11 is enclosed within a sheet metal cover 84 which fits snugly against the insulating ring and which is supported by a plurality of posts 86 upstanding from the support plate 26. The posts 86 are attached to the support plate by screws 88, and the cover 84 is attached to the posts 86 by screws 90.

The entire source 10 is disposed within an evacuated chamber containing an inert gas. In operation, a high voltage (D.C. or R.F.) power supply is activated to apply an electric field between the cathode assembly and the anode. In a magnetron source as illustrated herein, a magnetic field is superimposed on the electric field by means of the permanent magnets 20 and 22, tending to trap electrons within a tunnel-shaped area of flux lines along the surface of the target thus increasing the ion density adjacent the target and providing a high sputtering rate.

As sputtering progresses, the target 16 is eroded away in a manner which forms an annular trough in the target as illustrated by the lines 92 in FIG. 1. In accordance with the invention, a temperature sensor assembly 94 is disposed within a vertical bore formed in the cathode plate 18 such that a sensing element 96 is located closely adjacent the annular upper face of the target 16 and centrally disposed relative thereto adjacent the area of maximum erosion of the target.

The temperature sensor assembly per se does not form part of the present invention and will not be described herein in detail. In actual practice, it has been found that a Model No W2102-03, manufactured by Degussa Corporation has proven to give satisfactory results. The sensor assembly is connected to a temperature display or recorder 100, which can also be a type which is well known in the art, and commercially available.

Figure 2:
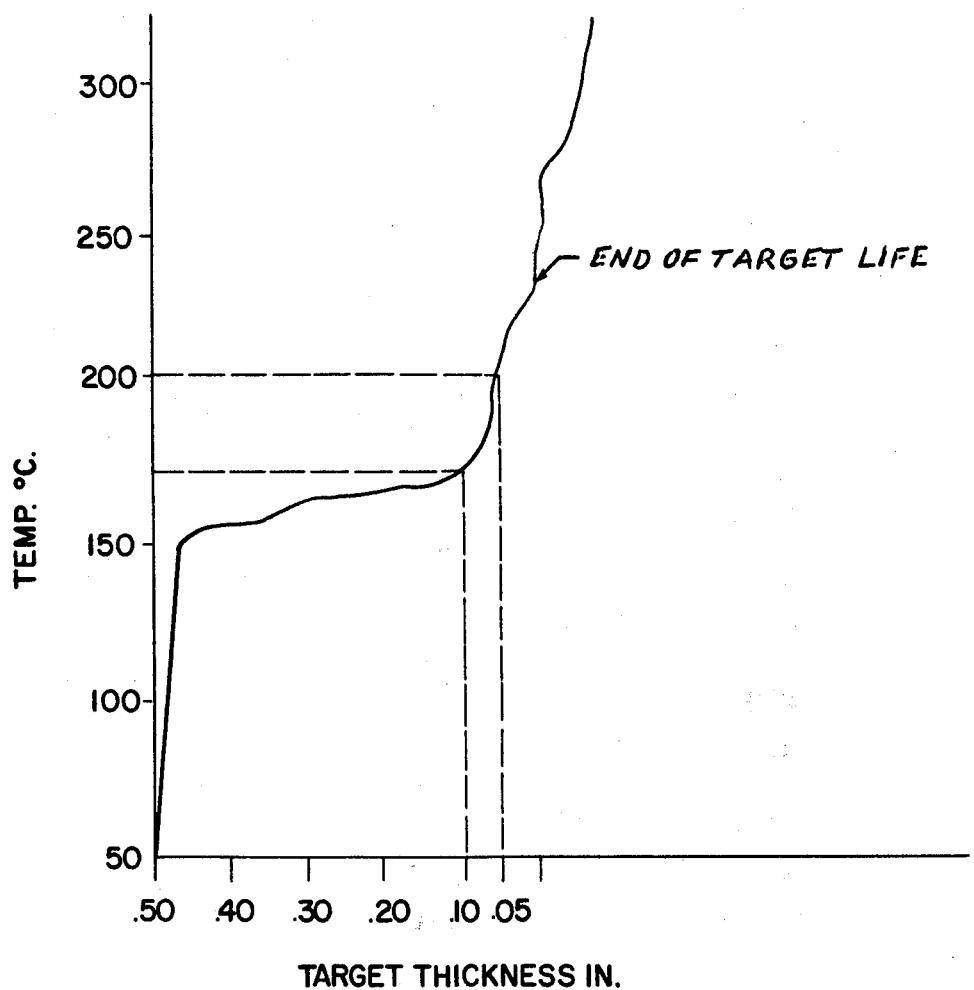
FIG. 2 is a graphical illustration of the relationship between the temperature of the cathode assembly and the target thickness.

Referring to FIG. 2, there is graphically illustrated the relationship between the thickness of the target at the point of maximum erosion, and the temperature of the cathode assembly as sensed by the sensor assembly and indicated by a readout element 102 of the recorder 100. In the example illustrated the target was five nines purity aluminum 1.4% silicon, which was shaped and mounted as illustrated in FIG. 1. It can be seen that once the system reached an operating temperature of 150° C. there was only a slight temperature rise as the thickness of the target went from approximately 0.48 in. to approximately 0.10 in; however, there was a sharp rise in the slope of the curve between 0.10 in. thickness and 0.05 in. thickness, wherein the temperature rose from about 175° C. to 210° C. It can thus be appreciated that a temperature reading of over 200° C. indicated that the target was within 0.05 in. of eroding through and that the sputtering process should be stopped and a new target installed. It should be noted of course, that the above figures apply to a sample actually tested, and that targets formed of other materials and having different initial thicknesses can be expected to yield somewhat different results.

I claim:

1. A method for operating a magnetron sputtering apparatus of the type which includes a sputtering target having a flat surface in contact with a flat surface of a cathode of said apparatus, including monitoring the temperature of said cathode at a point adjacent said flat surface of said cathode, and ceasing operation of said apparatus and replacing said sputtering target when said temperature reaches a predetermined value.

2. The method as claimed in claim 1, in which the temperature of said cathode is monitored at a location corresponding to the area of maximum erosion of said sputtering target.

* * * * *